(12) United States Patent
Mutter et al.

(10) Patent No.: US 11,088,510 B2
(45) Date of Patent: Aug. 10, 2021

(54) MOISTURE CONTROL IN OXIDE-CONFINED VERTICAL CAVITY SURFACE-EMITTING LASERS

(71) Applicant: II-VI Delaware, Inc., Wilmington, DE (US)

(72) Inventors: Lukas Mutter, Uster (CH); Norbert Lichtenstein, Langnau a. Albis (CH)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 16/674,404

(22) Filed: Nov. 5, 2019

(65) Prior Publication Data

US 2021/0135427 A1 May 6, 2021

(51) Int. Cl.
| *H01S 5/183* | (2006.01) |
| *H01S 5/028* | (2006.01) |
| *H01S 5/187* | (2006.01) |
| *H01S 5/34*  | (2006.01) |

(52) U.S. Cl.
CPC ........ *H01S 5/18313* (2013.01); *H01S 5/0281* (2013.01); *H01S 5/0282* (2013.01); *H01S 5/187* (2013.01); *H01S 5/34* (2013.01)

(58) Field of Classification Search
CPC .. H01S 5/18313; H01S 5/0282; H01S 5/0281; H01S 5/187; H01S 5/34
See application file for complete search history.

(56) References Cited

U.S. PATENT DOCUMENTS

| 6,949,473 | B2 | 9/2005 | Biard et al. |
| 8,189,642 | B1 | 5/2012 | Li et al. |
| 8,502,852 | B2 | 8/2013 | Numata et al. |
| 8,592,236 | B2 | 11/2013 | Albrecht et al. |
| 8,679,873 | B2 | 3/2014 | Pan et al. |
| 9,520,696 | B2 | 12/2016 | Wang et al. |
| 9,997,892 | B2 | 6/2018 | Johnson |
| 10,122,152 | B1 | 11/2018 | Lin et al. |
| 2003/0086463 | A1 | 5/2003 | Shin et al. |
| 2005/0201436 | A1 | 9/2005 | Collins |
| 2008/0112442 | A1* | 5/2008 | Ikuta ................... H01S 5/18386 372/19 |

(Continued)

OTHER PUBLICATIONS

Marigo-Lombart, Ludovic et al., "Oxide-Confined VSELs Fabricated with a Simple Self-Aligned Process Flow", Science and Technology, IOP Publishing, 2017, 32 (12), pp. 125004.

*Primary Examiner* — Xinning(Tom) Niu

(74) *Attorney, Agent, or Firm* — Wendy W. Koba

(57) ABSTRACT

A fabrication sequence for an oxide-confined VCSEL includes the deposition of a protective coating over exposed horizontal surfaces to prevent unwanted oxide layers from being formed during the lateral oxidation process used to create the oxide aperture. By preventing the oxidation of these surfaces in the first instance, the opportunity for moisture to gain access to the active region of the VCSEL is eliminated. For example, exposed Al-containing surfaces are covered with a protective coating of dielectric material prior to initiating the conventional lateral oxidation process used to form the oxide aperture of the VCSEL. With the protective coating in place, a conventional fabrication process is resumed, and the protective coating ultimately forms part of the passivation layer used to provide electrical isolation for the final VCSEL device.

13 Claims, 5 Drawing Sheets

(56) References Cited

U.S. PATENT DOCUMENTS

| | | | |
|---|---|---|---|
| 2010/0220758 A1* | 9/2010 | Brenner | H01S 5/1021 |
| | | | 372/45.01 |
| 2011/0027924 A1* | 2/2011 | Ikuta | H01S 5/18333 |
| | | | 438/29 |
| 2013/0051421 A1 | 2/2013 | Traut et al. | |
| 2018/0076598 A1* | 3/2018 | Moench | H01S 5/06825 |

\* cited by examiner

MOISTURE CONTROL IN OXIDE-CONFINED VERTICAL CAVITY SURFACE-EMITTING LASERS

TECHNICAL FIELD

The present invention relates to vertical cavity surface-emitting lasers (VCSELs) and, more particularly, to a technique for minimizing moisture intrusion into mesa structure of oxide-confined VCSELs.

BACKGROUND OF THE INVENTION

In the fabrication of VCSELs that utilize an oxide aperture to provide current confinement, the aperture is typically created by oxidizing the exposed mesa structure of a distributed Bragg reflector (DBR) portion of the VCSEL. A selected layer within the mesa is formed a priori to exhibit a higher concentration of a material that is quickly oxidized with respect to the remaining layers in the structure. In a GaAs-based VCSEL device, an aperture layer of $Al_xGa_{1-x}As$ may be purposely formed to exhibit an aluminum content x of 0.9 or more (for example), since aluminum is known to have a high oxidation rate. Commonly, the lateral oxidation progresses inwardly from the exposed mesa sidewalls and therefore results in creating a central aperture shape that mimics the topology of the mesa itself. The oxidation rate depends on factors such as the material composition of the $Al_xGa_{1-x}As$ layer, layer thickness, oxidation temperature, and the like.

Unfortunately, the oxidation process also results in other exposed Al-containing surfaces to be slightly oxidized as well. In particular, the trench surround the VCSEL mesa structure is slightly oxidized, forming an AlGa-Oxide (AGO) on the top surface of the trench. As a result, moisture can propagate through entry points in the AGO layer and reach the mesa, degrading the performance and/or reliability of the VCSEL's emitter.

One approach to solving the moisture intrusion problem includes depositing multiple passivation layers after the oxidation process, in an attempt to increase the likelihood that all "pinholes" formed within the AGO layer will be covered, preventing any external moisture from propagating through. However, any moisture present prior to the deposit of the outermost passivation layer will still remain trapped and able to degrade the device performance. Another approach is based upon the utilization of a specialized passivation film with hydrophobic properties.

SUMMARY OF THE INVENTION

The present invention addresses problems associated with the presence of moisture in oxide-confined VCSEL structures, and in particular is directed to modifying the fabrication process to prevent unwanted oxide layers from being formed in the first instance, which therefore eliminates the opportunity for moisture to gain access through these oxides.

In accordance with the principles of the present invention, exposed Al-containing surfaces are covered with a protective coating of dielectric material prior to initiating the conventional lateral oxidation process used to form the oxide aperture of the VCSEL. The protective coating eliminates the possibility of an unwanted AGO layer to form in the first instance by not leaving Al-containing material exposed and available for oxidation. With the protective coating in place, a conventional fabrication process is resumed, with the protective coating ultimately forming part of the passivation layer used to provide electrical isolation for the final VCSEL device. The thickness of the deposited passivation layer may be adjusted to accommodate the presence of protective coating, but this is not required.

In some preferred embodiments, the same dielectric material may be used for both the pre-oxidation protective coating and final passivation layer. For example, silicon nitride may be used for both the protective coating and the passivation layer. In other cases, different materials may be used, as long as protective coating comprises a dielectric material that protects the underlying Al-containing surface layer and substantially eliminates the formation of an unwanted AGO layer.

An exemplary embodiment of the invention takes the form of VCSEL that comprises a substrate, on which are disposed first and second distributed Bragg reflectors (DBRs), each DBR comprising a stack of layers of alternating refractive index value, with the second DBR formed as a mesa structure having an external boundary exposing end regions of the stack of layers. An active layer is positioned between the first and second DBRs, with an aperture layer disposed within the second DBR, the aperture layer formed to have a higher concentration of an oxidizing element than the remaining layers in the stack of layers. The VCSEL also includes a protective coating of a dielectric material deposited to cover exposed horizontal surface portions of the first and second DBRs.

The principles of the present invention are also embodied within a method of fabrication an oxide-confined VCSEL that includes the steps of: a) growing, on a substrate, a stack of layers of alternating refractive index and controlled thickness to form a first distributed Bragg reflector (DBR); b) forming an active region of a multiple quantum well structure over the first DBR; c) growing a stack of layers of alternating refractive index and controlled thickness over the active region to form a second DBR, wherein a layer within the stack of second DBR layers is defined as an aperture layer and exhibits a higher concentration of an oxide-forming element than remaining layers in the stack of second DBR layers; d) etching the stack of layers of the second DBR to form a mesa structure exposing edges of layers including the aperture layer, the etching forming a trench around the mesa structure, the trench having a top surface layer including an oxidizing material; e) covering the trench with a protective coating; and f) performing a lateral oxidation process on the aperture layer so create an oxide aperture within the VCSEL.

Other and further embodiments and aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Vertical cavity surface-emitting lasers (VCSELs) consist of a pair of distributed Bragg reflectors (DBRs) that function as the opposing mirror surfaces of a laser cavity, with the laser's active region and current-confining structure positioned between the pair of DBRs. An exemplary DBR is formed of relatively thin layers of alternating composition, one set of layers exhibiting a relatively high refractive index and the other set of layers exhibiting a relatively low refractive index so that the alternating arrangement of the two types of layers form the required reflective (mirror) structure. In a GaAs-based VCSEL device structure, the DBRs are formed of alternating layers of GaAs and AlGaAs.

Figure 1:
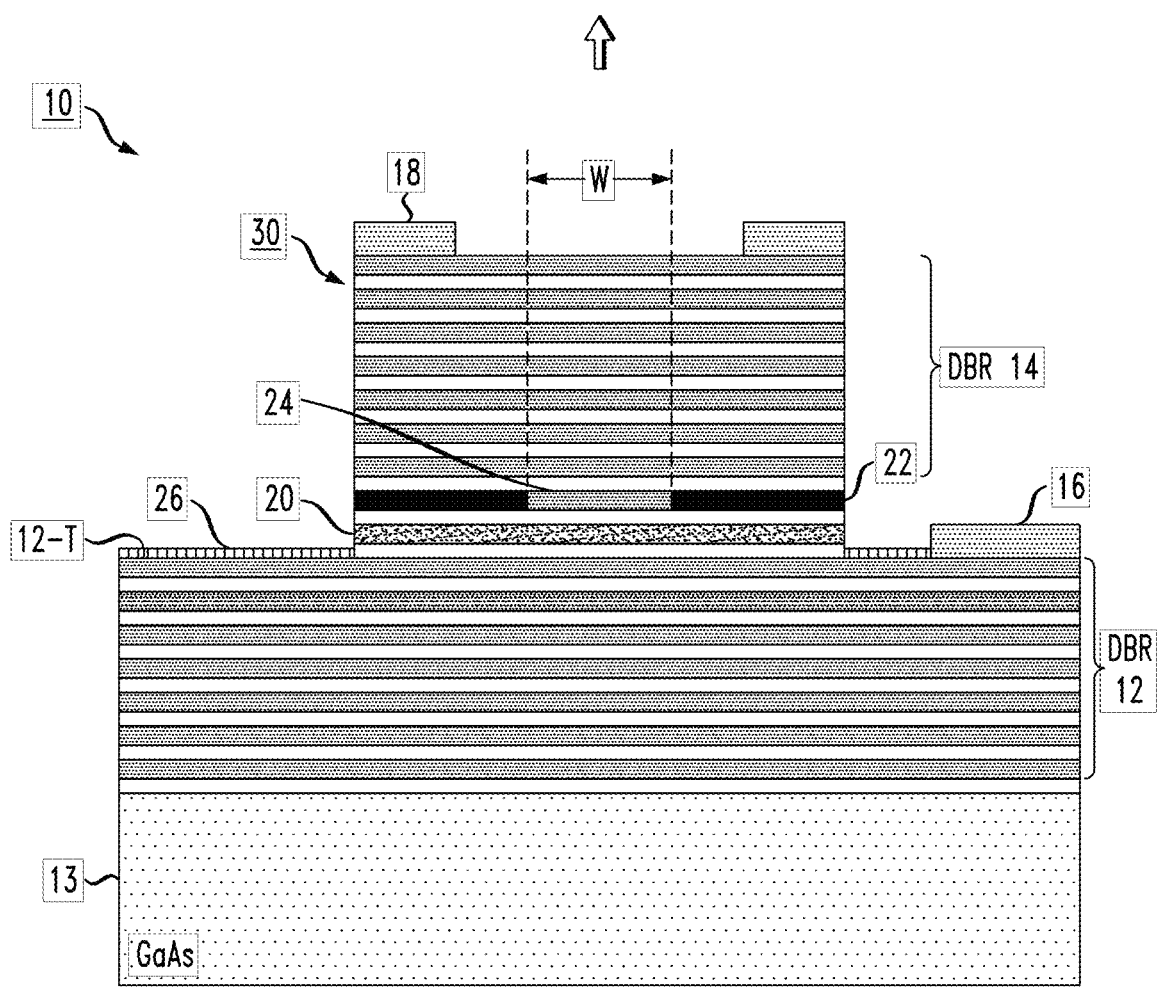
FIG. 1 is a cut-away view of a prior art oxide-confined VCSEL, showing the formation of an unwanted oxide layer on the trench surface of the device.

FIG. 1 is a simplified cut-away view of a conventional prior art VCSEL 10, illustrating a first DBR 12 (grown on a GaAs substrate 13) and a second (opposing) DBR 14. As shown, second DBR 14 is formed to exhibit a mesa structure, allowing for top-side electrical contacts to be made to both first DBR 12 (in the form of a deposited first contact 16) and second DBR 14 (here, a deposited second contact 18). Other configurations may position first contact 16 on the backside of substrate 13, as well-known in the art. An active region 20 comprising one or more quantum well layers is formed between first DBR 12 and second DBR 14, with a current-confining aperture layer 22 including a central region 24 of different composition (hereinafter referred to as "oxide aperture 24") formed above active region 20. As is known in the art, oxide aperture 24 is used to confine the electrical current and propagating optical modes to the center of the structure, with the light beam created by VCSEL 10 exiting through the top surface, out of second DBR 14.

The mesa structure of second DBR 14 is typically defined by means of a lithographic process followed by an etching step, where a conventional mesa 30 has a generally circular cross-section, being either cylindrical or conic in three-dimensional form. As evident from the illustration of FIG. 1, the formation of mesa structure 30 exposes sidewall regions of the individual AlGaAs layers forming second DBR 14, including aperture layer 22. Aperture layer 22 comprises an AlGaAs layer having an increased proportion of aluminum relative to the remainder of the AlGaAs layers within the structure. The higher aluminum concentration results a higher oxidation rate of aperture layer 22 with respect to the remaining layers during the lateral oxidation process used to create oxide aperture 24. Controlling oxidation parameters in a known manner allows for an oxide aperture 24 of a desired width W to be formed.

While useful in creating an aperture of the desired geometry, the conventional lateral oxidation process used in VCSEL formation also results in oxidizing (slightly) all other exposed Al-containing surfaces of the VCSEL structure. In particular, a top AlGaAs layer 12-T of first DBR 12 will be slightly oxidized during the lateral oxidation process. While the aluminum concentration in layer 12-T is significantly less than that of aperture layer 22, there is enough aluminum present to form a thin AlGa-Oxide (AGO) layer 26 over layer 12-T, as shown in FIG. 1. As a result of the unwanted formation of AGO layer 26, moisture from the external environment is able to penetrate through pinholes in this oxide, and propagate from these entry points (as shown by the arrows in FIG. 1), toward active region 20. The presence of moisture within the VCSEL device is known to degrade its performance and/or reduce its reliability.

In accordance with the principles of the present invention, it has been found that the possibility of moisture penetration may be eliminated by first coating Al-containing layers of the VCSEL structure with a protective material prior to initiating the lateral oxidation process. In particular, a dielectric material is preferably used as a protective coating so that there is no need to later remove the coating, instead retaining the coating as part of the final passivation layer of the fabricated device.

FIGS. 2-5 illustrate an exemplary process for including a protective coating layer within the VCSEL fabrication sequence associated with the creation of oxide aperture 24 via lateral oxidation. It is to be understood that the diagrams are not drawn to scale, and various details regarding process conditions not described here are well-understood by those skilled in the art.

Figure 2:
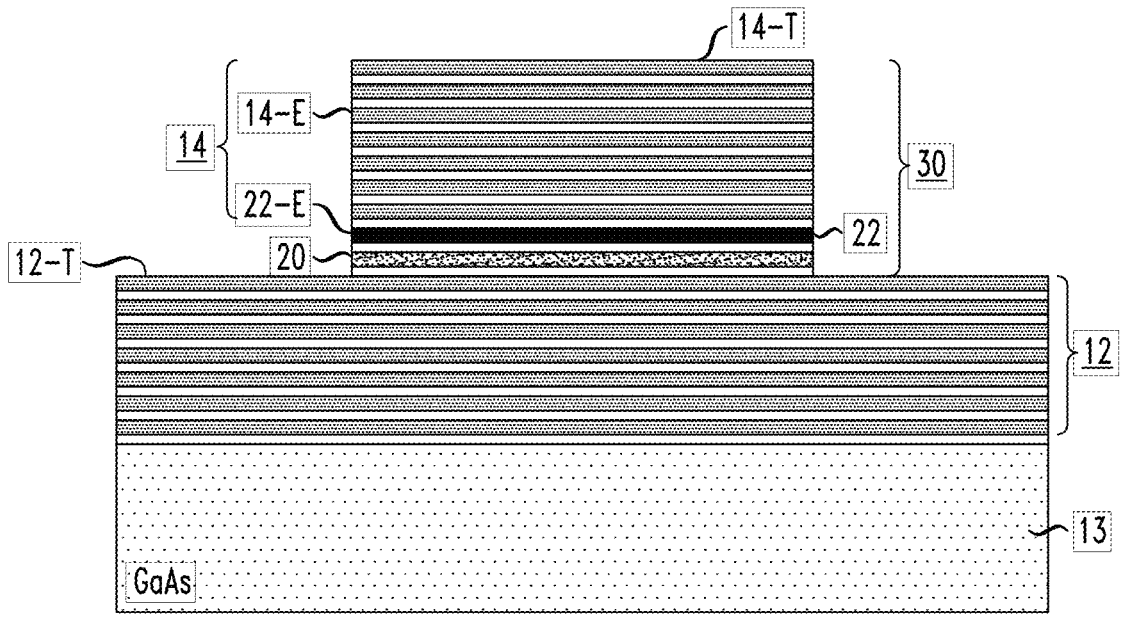
FIG. 2 illustrates a step in the VCSEL fabrication process, subsequent to the formation of the mesa structure within the top DBR.

FIG. 2 illustrates an exemplary VCSEL device structure immediately after processing second DBR 14 to create mesa structure 30. As noted above, the creation of mesa structure 30 exposes edges E of the individual layers forming second DBR 14. Also exposed is a top surface layer 12-T of first DBR 12 and a top surface layer 14-T of second DBR 14. Both of these layers also comprise AlGaAs, albeit with an aluminum concentration much less than that of aperture layer 22. Even so, the exposed aluminum within these layers will be slightly oxidized if a lateral oxidation process immediately follows as the next step in the fabrication sequence (as is the case in the prior art).

Figure 3:
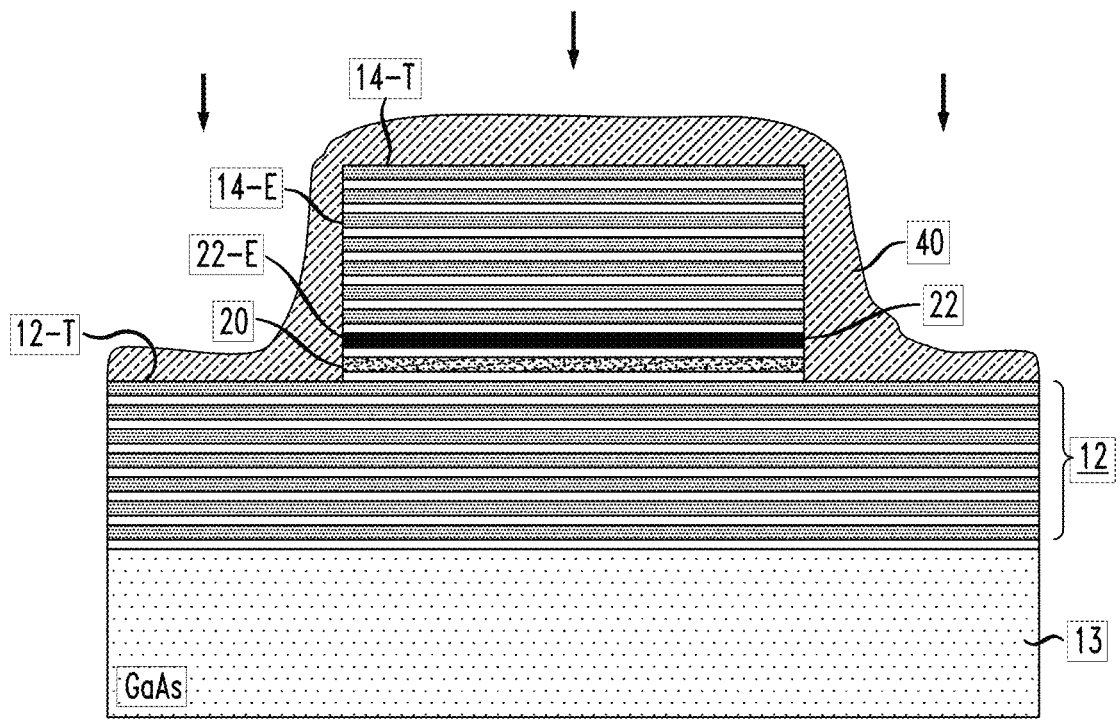
FIG. 3 shows a following step in the VCSEL fabrication process in accordance with present invention, the deposition of a coating material over the device as shown in FIG. 2.
Figure 4:
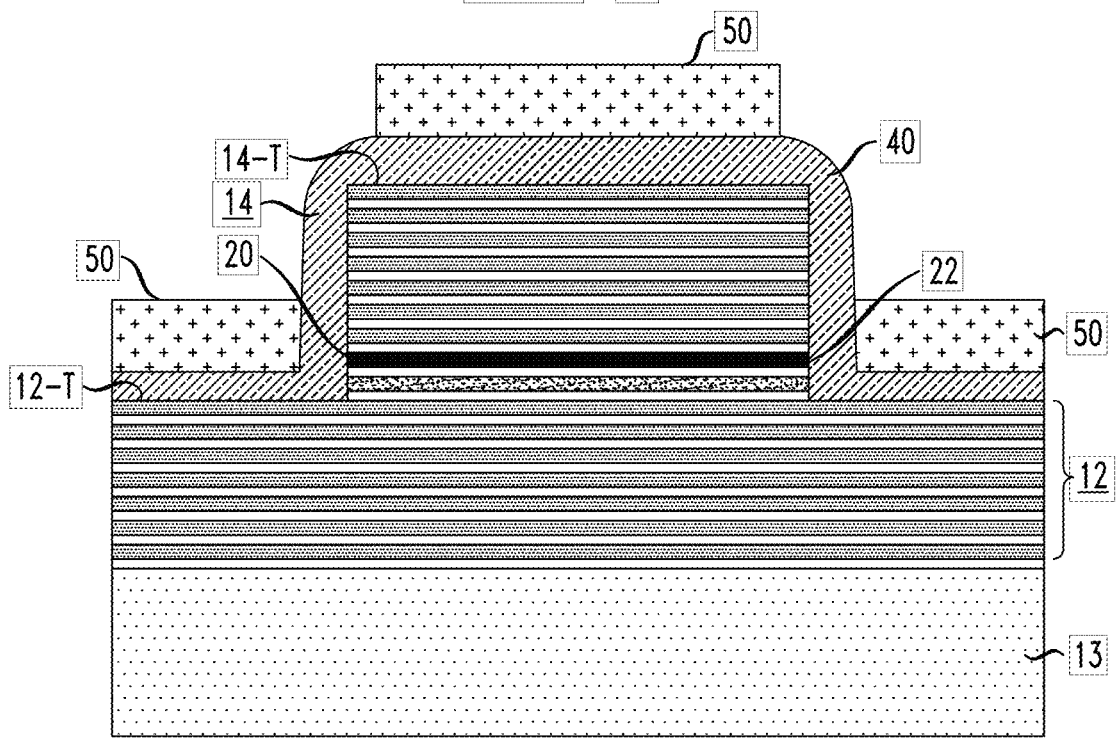
FIG. 4 illustrates the positioning of a mask layer over the deposited coating material, defining regions of the coating material to be removed prior to a lateral oxidation process.

In contrast to the prior art process, however, the inventive sequence proceeds to form a protective coating over these Al-containing surface layers so as to prevent the surface-exposed aluminum from oxidizing and forming an AGO layer. FIG. 3 illustrates the deposition of a protective coating 40, which in this case creates a conformal coating over the complete exposed surface of the VCSEL structure. Protective layer 40 may comprise any suitable dielectric material including, for example, SiNx, SiOx, AlOx, or the like.

Figure 5:
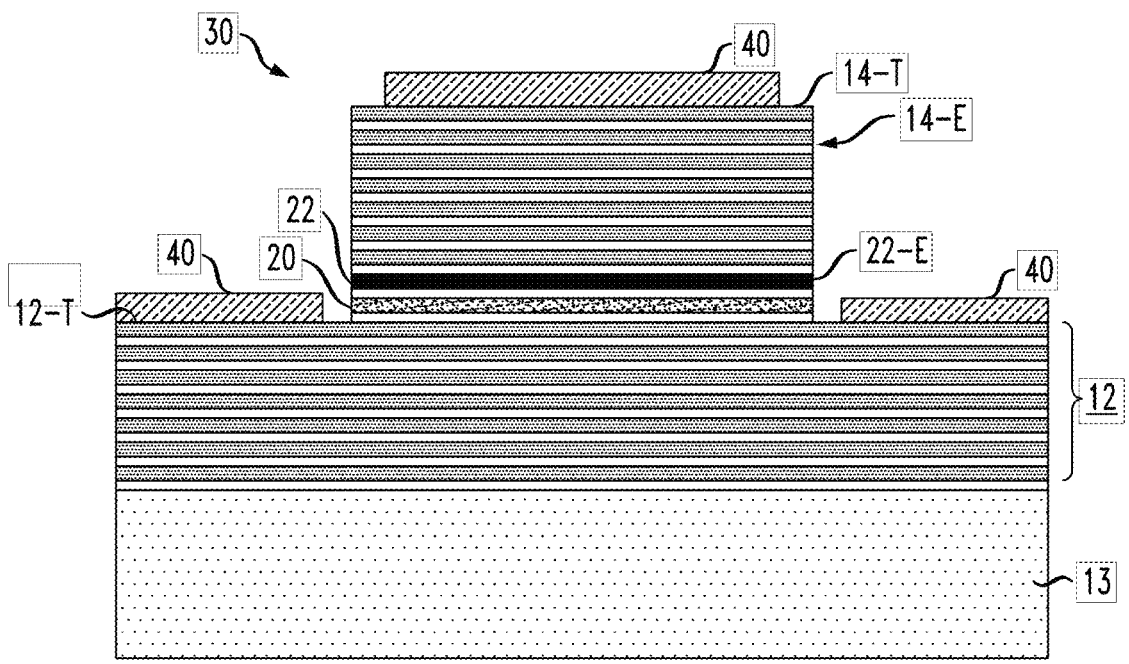
FIG. 5 illustrates the following step, with the defined portions of the coating material being removed by etching to expose the mesa structure.

Once deposited, protective coating 40 is patterned (as shown by masking layer 50 in FIG. 4) and etched to expose the edges of aperture layer 22, as shown in FIG. 5, so that a conventional lateral oxidation process will react with only high-aluminum-content aperture layer 22. The patterning of protecting coating 40 is specifically defined and controlled such that the majority of Al-containing layers 12-T and 14-T remain covered by protective coating 40 and will not be oxidized during the following lateral oxidation process used to create oxide aperture 24.

Figure 6:
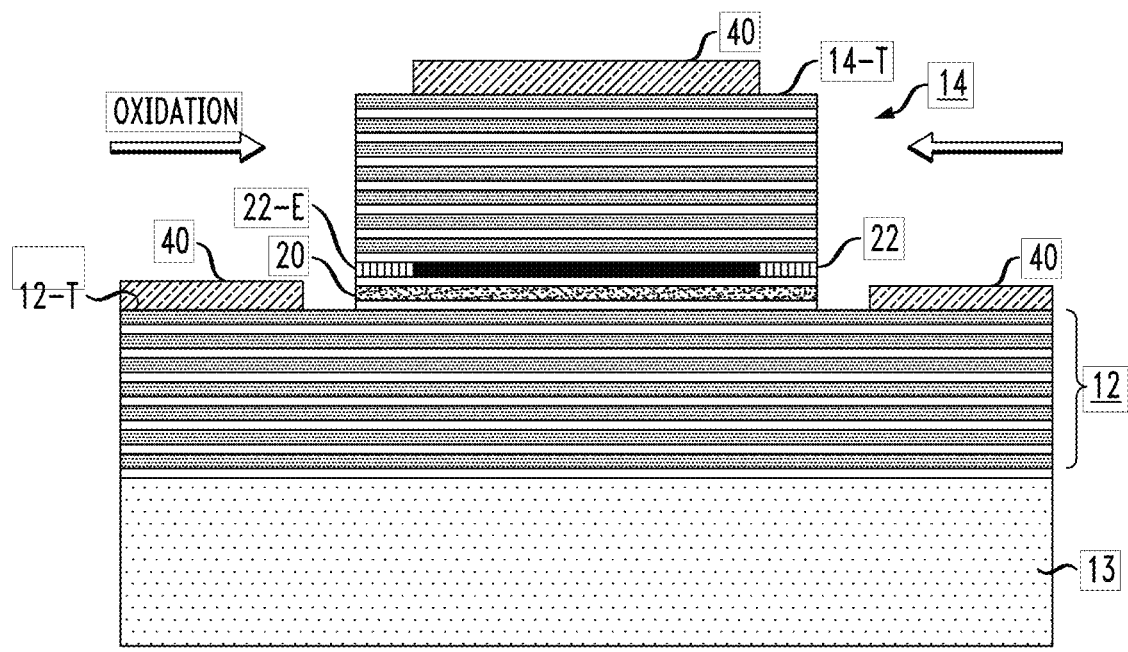
FIG. 6 illustrates the initiation of a lateral oxidation process, where the aperture layer within the top DBR begins to oxidize.
Figure 7:
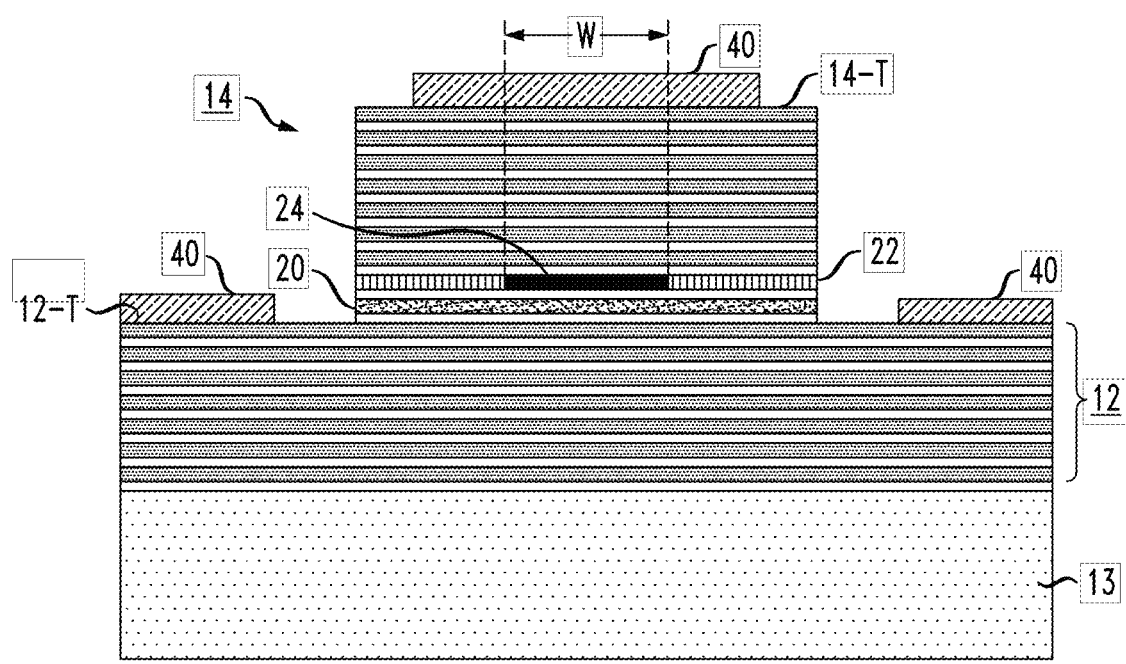
FIG. 7 illustrates the configuration of the VCSEL at the completion of the lateral oxidation process, creating an oxide aperture of a desired width W.

Once protective coating 40 has been patterned and etched, the conventional VCSEL fabrication process may then resume, as shown in FIG. 6. Here, the VCSEL structure is subjected to a mixture of $N_2/H_2/H_2O$ (for example) at an elevated temperature sufficient to initiate the oxidation of exposed outer edge 22-E of aperture layer 22 (i.e., a "lateral oxidation" process). The advance of the oxidized portion of aperture layer 22 from the outer edge of the mesa toward the center of the structure is shown by the arrows in FIG. 6. FIG. 7 illustrates the structure at the completion of the lateral oxidation process, with the final form of oxide aperture 24 exhibiting the desired width W.

Figure 8:
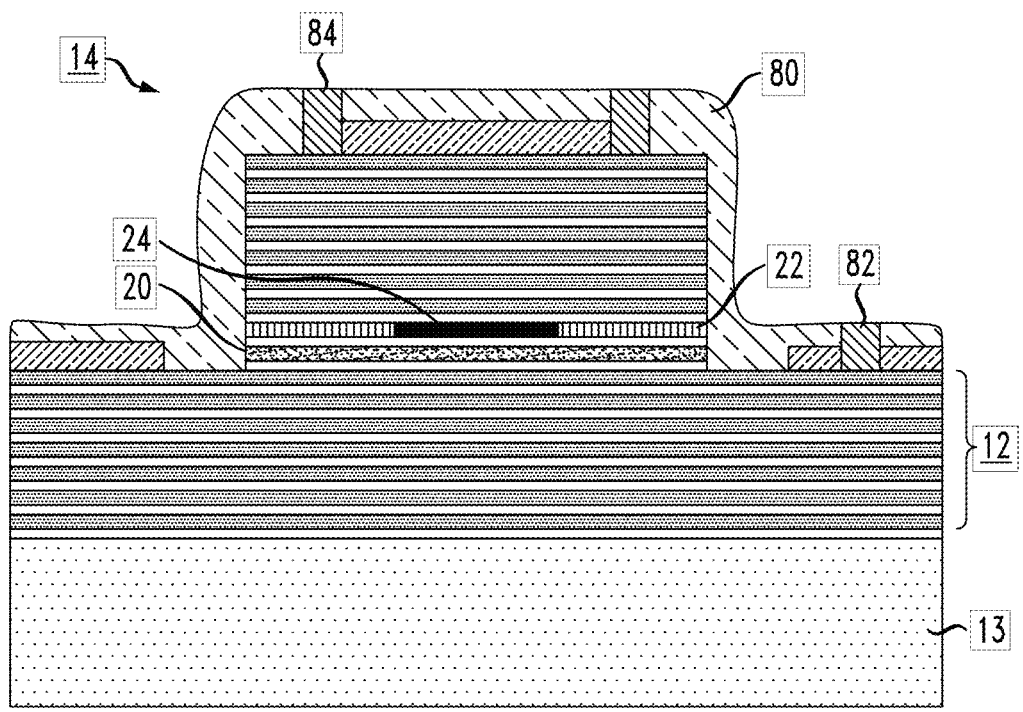
FIG. 8 illustrates a final VCSEL device, including a passivation layer formed over the protective coating and the mesa, and conductive contacts to both DBRs.

In accordance with the teachings of the present invention, protective coating 40 remains intact during the lateral oxidation process and thus prevents the formation of an AGO (surface oxide) layer across top layer 12-T of first DBR 12 and top layer 14-T of second DBR 14. Subsequent to the formation of oxide aperture 24, a standard passivation layer 80 is deposited over the structure, as shown in FIG. 8, with the remaining portions of protective coating 40 forming part of this final electrical insulation for the VCSEL device. While passivation layer 80 may be formed of the same dielectric material as protective coating 40, it is not required. Additional steps of creating a first electrical contact 82 for first DBR 12 and a second electrical contact 84 for second DBR 14 may be performed prior to, or subsequent to, the steps as outlined above for forming the protective coating. First electrical contact 82 may be located on the "top surface" of the VCSEL structure, as shown in FIG. 8 or, alternatively, formed as a "backside" contact on the lower surface of substrate 13, as with typical VCSEL fabrication processes.

While the foregoing is directed to embodiments of the present invention, other and further embodiments of the invention may be devised without departing from the basic scope thereof, which is determined by the claims that follow.

What is claimed is:

1. A vertical cavity surface emitting laser (VCSEL) comprising:
   a substrate, on which are disposed first and second distributed Bragg reflectors (DBRs), each DBR comprising a stack of layers of alternating refractive index value, the second DBR formed as a mesa structure having an external boundary exposing end regions of the stack of layers;
   an active layer disposed between the first and second DBRs;
   an aperture layer disposed within the second DBR and having a higher concentration of an oxidizing element than the remaining layers in the stack of layers; and
   a protective coating deposited to cover only exposed horizontal surface portions of the first and second DBRs.

2. The VCSEL as defined in claim 1 wherein the aperture layer and a top surface layer of the first DBR contain aluminum, with the aperture layer formed to exhibit a higher aluminum concentration than the top surface layer of the first DBR.

3. The VCSEL as defined in claim 1 wherein the protective coating is a dielectric material.

4. The VCSEL as defined in claim 3 wherein the protective coating of dielectric material is selected from the group consisting of: SiNx, SiOx, and AlOx.

5. The VCSEL as defined in claim 1 wherein the VCSEL further comprises an outer passivation layer deposited to cover the protective coating and exposed end regions of the mesa structure of the second DBR.

6. A method of fabrication an oxide-confined vertical cavity surface-emitting laser (VCSEL), comprising:
   a) growing, on a substrate, a stack of layers of alternating refractive index and controlled thickness to form a first distributed Bragg reflector (DBR);
   b) forming an active region of a multiple quantum well structure over the first DBR;
   c) growing a stack of layers of alternating refractive index and controlled thickness over the active region to form a second DBR, wherein a layer within the stack of second DBR layers is defined as an aperture layer and exhibits a higher concentration of an oxide-forming element than remaining layers in the stack of second DBR layers;
   d) etching the stack of layers of the second DBR to form a mesa structure exposing edges of layers including the aperture layer, the etching forming a trench around the mesa structure, the trench having a top surface layer including an oxidizing material;
   e) covering the horizontal surfaces of the trench with a protective coating; and
   f) performing a lateral oxidation process on the aperture layer so create an oxide aperture within the VCSEL.

7. The method as defined in claim 6 wherein step e) includes the steps of:
   depositing a conformal coating over the etched structure;
   patterning the conformal coating to define the edge region of the mesa structure to be exposed and not covered by the protective coating;
   etching the patterned conformal coating to remove defined portions along the sidewalls of the mesa structure to define the protective coating as covering the horizontal surfaces of the trench.

8. The method as defined in claim 6 wherein the protective coating comprises a dielectric material.

9. The method as defined in claim 6, further comprising the step of
   g) depositing a passivation layer over the structure formed in step f) so as to cover the protective coating and the exposed edge region of the mesa structure.

10. The method as defined in claim 9 wherein the passivation layer comprises a dielectric material.

11. The method as defined in claim 9 wherein the protective coating and the passivation layer comprise the same dielectric material.

12. The method as defined in claim 9 wherein the protective coating and the passivation layer comprise different dielectric materials.

13. The method as defined in claim 6 wherein the aperture layer and the trench top surface layer comprise aluminum, with the aperture layer having a higher aluminum content than the trench top surface layer.

\* \* \* \* \*